United States Patent
Wang et al.

(10) Patent No.: US 12,147,674 B1
(45) Date of Patent: Nov. 19, 2024

(54) MEMORY CONTROL METHOD, MEMORY STORAGE DEVICE AND MEMORY CONTROL CIRCUIT UNIT

(71) Applicant: Hefei Core Storage Electronic Limited, Anhui (CN)

(72) Inventors: Chih-Ling Wang, Anhui (CN); Dong Dong Yao, Anhui (CN); Kuai Cao, Anhui (CN)

(73) Assignee: Hefei Core Storage Electronic Limited, Anhui (CN)

( * ) Notice: Subject to any disclaimer, the term of this patent is extended or adjusted under 35 U.S.C. 154(b) by 0 days.

(21) Appl. No.: 18/761,237

(22) Filed: Jul. 1, 2024

(30) Foreign Application Priority Data

Jan. 25, 2024 (CN) .......................... 202410102312.7

(51) Int. Cl.
*G06F 3/06* (2006.01)
*G11C 29/12* (2006.01)

(52) U.S. Cl.
CPC ............ *G06F 3/061* (2013.01); *G06F 3/0653* (2013.01); *G06F 3/0659* (2013.01); *G06F 3/0679* (2013.01); *G11C 29/12005* (2013.01); *G11C 2029/1202* (2013.01)

(58) Field of Classification Search
CPC ...... G06F 3/061; G06F 3/0619; G06F 3/0653; G06F 3/0659; G06F 3/0679; G11C 29/12005; G11C 2029/1202
USPC ....................................................... 711/103
See application file for complete search history.

(56) References Cited

U.S. PATENT DOCUMENTS

| | | | |
|---|---|---|---|
| 2009/0323412 A1* | 12/2009 | Mokhlesi | G11C 11/5642 365/185.02 |
| 2012/0221772 A1 | 8/2012 | Seol et al. | |
| 2018/0188984 A1 | 7/2018 | Tai et al. | |
| 2019/0213078 A1 | 7/2019 | Date et al. | |

(Continued)

FOREIGN PATENT DOCUMENTS

| | | |
|---|---|---|
| CN | 105022695 | 11/2015 |
| CN | 106681653 | 5/2017 |

(Continued)

OTHER PUBLICATIONS

"Office Action of Taiwan Counterpart Application", issued on Jul. 17, 2024, p. 1-p. 8.

*Primary Examiner* — Than Nguyen
(74) *Attorney, Agent, or Firm* — JCIPRNET

(57) ABSTRACT

A memory control method, a memory storage device and a memory control circuit unit are provided. The method includes: setting preset read count thresholds corresponding to physical erasing units respectively; in a background operation, in response to a read count of a first physical erasing unit in the physical erasing units being greater than its corresponding preset read count threshold, reading word lines in the first physical erasing unit to obtain first error bit amounts; determining whether a refresh operation needs to be performed on the first physical erasing unit according to first error bit amounts; in response to no need to perform the refresh operation on the first physical erasing unit, selecting a first word line with the largest first error bit amount in the word lines, and detecting a voltage distribution variation of the first word line; and calculating a new read count threshold of the first physical erasing unit according to the voltage distribution variation.

27 Claims, 6 Drawing Sheets

(56) References Cited

U.S. PATENT DOCUMENTS

| | | | |
|---|---|---|---|
| 2019/0294358 A1* | 9/2019 | Suzuki | G06F 3/064 |
| 2019/0303239 A1 | 10/2019 | Hsiao et al. | |
| 2020/0097211 A1* | 3/2020 | Alsasua | G06F 3/0659 |
| 2021/0280256 A1* | 9/2021 | Yamabe | G11C 11/5671 |
| 2023/0101414 A1 | 3/2023 | Hassner et al. | |
| 2024/0055046 A1* | 2/2024 | Rayaprolu | G11C 7/24 |
| 2024/0201875 A1* | 6/2024 | Juan | G06F 3/0625 |

FOREIGN PATENT DOCUMENTS

| | | |
|---|---|---|
| CN | 107943712 | 4/2018 |
| CN | 109065092 | 12/2018 |
| CN | 115933998 | 4/2023 |
| TW | I569273 | 2/2017 |
| TW | 202125265 | 7/2021 |
| TW | I796882 | 3/2023 |

* cited by examiner

MEMORY CONTROL METHOD, MEMORY STORAGE DEVICE AND MEMORY CONTROL CIRCUIT UNIT

CROSS-REFERENCE TO RELATED APPLICATION

This application claims the priority benefit of China application serial no. 202410102312.7, filed on Jan. 25, 2024. The entirety of the above-mentioned patent application is hereby incorporated by reference herein and made a part of this specification.

BACKGROUND

Technical Field

The disclosure relates to a memory management technology, and in particular relates to a memory control method, a memory storage device and a memory control circuit unit.

Description of Related Art

As smart phones, tablet computers and personal computers have grown rapidly in recent years, the demand of consumers for storage media to has also increased rapidly. Since a rewriteable non-volatile memory module (such as flash memories) has the characteristics of data non-volatility, power saving, small size, and having no mechanical structure, it is very suitable for being built in a variety of portable multimedia devices as exemplified above. A solid-state drive is a memory storage device that uses a flash memory module as a storage medium. Therefore, the flash memory industry has become a very popular part of the electronics industry in recent years.

Generally speaking, when data stored in a physical programming unit in a physical erasing unit is read for multiple times (for example, a read count reaches one hundred thousand to one million times), the data stored in the physical programming unit is likely to have error bits or be lost due to repeated applying of a read voltage to memory cells, and may even cause that data stored in other physical programming units in the same physical erasing unit to have error bits or be lost. Such phenomenon is generally referred to as read disturb.

In order to avoid the phenomenon of read disturb, nowadays a memory storage device may generate a plurality of fixed read count thresholds in stages based on a program/erase cycle (PE cycle) count. However, there are certain drawbacks in using the fixed read count threshold. If a more stringent read count threshold is adopted, it may result in waste of processing cost. If a relatively loose read count threshold is adopted, it is impossible to immediately perform an operation to prevent read disturb, resulting in data loss. Therefore, how to set an appropriate read count threshold is actually one of the topics that those skilled in the art of the disclosure are devoted to.

SUMMARY

In view of this, the disclosure provides a memory control method, a memory storage device and a memory control circuit unit, may adaptively adjust a read count threshold of a physical erasing unit according to actual usage conditions to effectively suppress a probability of read disturb and improve the performance of a rewritable non-volatile memory module.

An exemplary embodiment of the disclosure provides a memory control method adapted to a memory storage device. The memory storage device includes a rewritable non-volatile memory module. The rewritable non-volatile memory module includes a plurality of physical erasing units. The memory control method includes: setting a plurality of preset read count thresholds respectively corresponding to a plurality of physical erasing units; in a background operation, in response to a read count of a first physical erasing unit in a plurality of physical erasing units being greater than its corresponding preset read count threshold, reading a plurality of word lines in the first physical erasing unit to obtain a plurality of first error bit amounts; determining whether a refresh operation needs to be performed on the first physical erasing unit according to a plurality of first error bit amounts; in response to no need to perform the refresh operation on the first physical erasing unit, selecting a first word line with the largest first error bit amount in a plurality of word lines, and detecting a voltage distribution variation of the first word line; and calculating a new read count threshold of the first physical erasing unit according to the voltage distribution variation.

In an exemplary embodiment of the disclosure, the step of determining whether the refresh operation needs to be performed on the first physical erasing unit according to a plurality of first error bit amounts includes: determining whether a plurality of first error bit amounts are all less than a first threshold; and in response to a plurality of first error bit amounts all being less than the first threshold, determining that the refresh operation does not need to be performed on the first physical erasing unit.

In an exemplary embodiment of the disclosure, the step of determining whether the refresh operation needs to be performed on the first physical erasing unit according to a plurality of first error bit amounts includes: in response to at least one first error bit amount being greater than or equal to the first threshold, performing a read retry operation on at least one word line with the at least one first error bit amount to obtain at least one second error bit amount.

In an exemplary embodiment of the disclosure, the step of determining whether the refresh operation needs to be performed on the first physical erasing unit according to a plurality of first error bit amounts includes: determining whether the at least one second error bit amount is less than a second threshold; and in response to the at least one second error bit amount being less than the second threshold, determining that the refresh operation does not need to be performed on the first physical erasing unit.

In an exemplary embodiment of the disclosure, the step of determining whether the refresh operation needs to be performed on the first physical erasing unit according to a plurality of first error bit amounts includes: in response to at least one of the at least one second error bit amount being greater than or equal to the second threshold, determining that the refresh operation needs to be performed on the first physical erasing unit.

In an exemplary embodiment of the disclosure, the step of calculating the new read count threshold of the first physical erasing unit according to the voltage distribution variation includes: obtaining a program/erase cycle count of the first physical erasing unit, and obtaining a threshold upper limit according to the program/erase cycle count.

In an exemplary embodiment of the disclosure, the step of calculating the new read count threshold of the first physical erasing unit according to the voltage distribution variation includes: calculating the new read count threshold according to the voltage distribution variation, the read count, the program/erase cycle count, and the threshold upper limit.

In an exemplary embodiment of the disclosure, the step of calculating the new read count threshold of the first physical erasing unit according to the voltage distribution variation includes: generating a predicted voltage distribution variation according to the program/erase cycle count and the read count through a threshold generation model; and comparing the voltage distribution variation and the predicted voltage distribution variation to calculate the new read count threshold.

In an exemplary embodiment of the disclosure, the threshold generation model is a support vector machines (SVM) model, a decision tree model, a polynomial regression model, a linear regression model or a recurrent neural network (RNN) model.

In an exemplary embodiment of the disclosure, the memory control method further includes: reading a plurality of physical programming units respectively corresponding to a plurality of word lines to obtain a plurality of first error bit amounts.

An exemplary embodiment of the disclosure provides a memory storage device, which includes a connection interface unit, a rewritable non-volatile memory module and a memory control circuit unit. The connection interface unit is configured to couple to a host system. The rewritable non-volatile memory module includes a plurality of physical erasing units. The memory control circuit unit is coupled to the connection interface unit and the rewritable non-volatile memory module. The memory control circuit unit is configured to set a plurality of preset read count thresholds respectively corresponding to a plurality of physical erasing units. The memory control circuit unit is further configured to read a plurality of word lines in a first physical erasing unit to obtain a plurality of first error bit amounts in response to a read count of the first physical erasing unit in a plurality of physical erasing units being greater than its corresponding preset read count threshold in a background operation. The memory control circuit unit is further configured to determine whether a refresh operation needs to be performed on the first physical erasing unit according to a plurality of first error bit amounts. The memory control circuit unit is further configured to select a first word line with the largest first error bit amount in a plurality of word lines in response to no need to perform the refresh operation on the first physical erasing unit, and detect a voltage distribution variation of the first word line. The memory control circuit unit is further configured to calculate a new read count threshold of the first physical erasing unit according to the voltage distribution variation.

In an exemplary embodiment of the disclosure, the memory control circuit unit is further configured to determine whether a plurality of first error bit amounts are all less than a first threshold. The memory control circuit unit is further configured to determine that the refresh operation does not need to be performed on the first physical erasing unit in response to a plurality of first error bit amounts all being less than the first threshold.

In an exemplary embodiment of the disclosure, the memory control circuit unit is further configured to perform a read retry operation on at least one word line having the at least one first error bit amount to obtain at least one second error bit amount in response to at least one first error bit amount being greater than or equal to the first threshold.

In an exemplary embodiment of the disclosure, the memory control circuit unit is further configured to determine whether the at least one second error bit amount is less than a second threshold. The memory control circuit unit is further configured to determine that the refresh operation does not need to be performed on the first physical erasing unit in response to the at least one second error bit amount being less than the second threshold.

In an exemplary embodiment of the disclosure, the memory control circuit unit is further configured to determine that the refresh operation needs to be performed on the first physical erasing unit in response to at least one of the at least one second error bit amount being greater than or equal to the second threshold.

In an exemplary embodiment of the disclosure, the memory control circuit unit is further configured to obtain a program/erase cycle count of the first physical erasing unit, and obtain a threshold upper limit according to the program/erase cycle count.

In an exemplary embodiment of the disclosure, the memory control circuit unit is further configured to calculate the new read count threshold according to the voltage distribution variation, the read count, the program/erase cycle count, and the threshold upper limit.

In an exemplary embodiment of the disclosure, the memory control circuit unit is further configured to generate a predicted voltage distribution variation according to the program/erase cycle count and the read count through a threshold generation model. The memory control circuit unit is further configured to compare the voltage distribution variation and the predicted voltage distribution variation to calculate the new read count threshold.

In an exemplary embodiment of the disclosure, the memory control circuit unit is further configured to read a plurality of physical programming units respectively corresponding to a plurality of word lines to obtain a plurality of first error bit amounts.

An exemplary embodiment of the disclosure provides a memory control circuit unit configured to control a rewritable non-volatile memory module. The rewritable non-volatile memory module includes a plurality of physical erasing units. The memory control circuit unit is coupled to the connection interface unit and the rewritable non-volatile memory module. The memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured to set a plurality of preset read count thresholds respectively corresponding to a plurality of physical erasing units. The memory management circuit is further configured to read a plurality of word lines in a first physical erasing unit to obtain a plurality of first error bit amounts in response to a read count of a first physical erasing unit in a plurality of physical erasing units being greater than its corresponding preset read count threshold in a background operation. The memory management circuit is further configured to determine whether a refresh operation needs to be performed on the first physical erasing unit according to a plurality of first error bit amounts. The memory management circuit is further configured to select a first word line with the largest first error bit amount in a plurality of word lines in response to no need to perform the refresh operation on the first physical erasing unit, and detect a voltage distribution variation of the first word line. The memory management circuit is further configured to calculate a new read count threshold of the first physical erasing unit according to the voltage distribution variation.

In an exemplary embodiment of the disclosure, the memory management circuit is further configured to determine whether a plurality of first error bit amounts are all less than a first threshold. The memory management circuit is further configured to determine that the refresh operation does not need to be performed on the first physical erasing unit in response to a plurality of first error bit amounts all being less than the first threshold.

In an exemplary embodiment of the disclosure, the memory management circuit is further configured to perform a read retry operation on at least one word line having the at least one first error bit amount to obtain at least one second error bit amount in response to at least one first error bit amount being greater than or equal to the first threshold.

In an exemplary embodiment of the disclosure, the memory management circuit is further configured to determine whether the at least one second error bit amount is less than a second threshold. The memory management circuit is further configured to determine that the refresh operation does not need to be performed on the first physical erasing unit in response to the at least one second error bit amount being less than the second threshold.

In an exemplary embodiment of the disclosure, the memory management circuit is further configured to determine that the refresh operation needs to be performed on the first physical erasing unit in response to at least one of the at least one second error bit amount being greater than or equal to the second threshold.

In an exemplary embodiment of the disclosure, the memory management circuit is further configured to obtain a program/erase cycle count of the first physical erasing unit, and obtain a threshold upper limit according to the program/erase cycle count.

In an exemplary embodiment of the disclosure, the memory management circuit is further configured to calculate the new read count threshold according to the voltage distribution variation, the read count, the program/erase cycle count, and the threshold upper limit.

In an exemplary embodiment of the disclosure, the memory management circuit is further configured to generate a predicted voltage distribution variation according to the program/erase cycle count and the read count through a threshold generation model. The memory management circuit is further configured to compare the voltage distribution variation and the predicted voltage distribution variation to calculate the new read count threshold.

In an exemplary embodiment of the disclosure, the memory management circuit is further configured to read a plurality of physical programming units respectively corresponding to a plurality of word lines to obtain a plurality of first error bit amounts.

Based on the above, the memory control method, the memory storage device and the memory control circuit unit of the disclosure are adapted to first set a plurality of preset read count thresholds for a plurality of physical erasing units of the rewritable non-volatile memory module (for example, a plurality of more stringent read count thresholds). In the background mode (i.e., the memory storage device is in a sleep mode), when a read count of a physical erasing unit is greater than its preset read count threshold, the memory storage device may determine whether the refresh operation is performed on the physical erasing unit. If it is determined that the refresh operation is required, the memory storage device performs the refresh operation on the physical erasing unit; conversely, if it is determined that the refresh operation is not required, the memory storage device calculates the new read count threshold based on the voltage distribution variation of the word line with the largest error bit amount in the physical erasing unit and other parameters related to a current usage status of the physical erasing unit.

Namely, the memory control method, memory storage device and memory control circuit unit of the disclosure may adaptively adjust the read count threshold of the physical erasing unit according to actual usage conditions to avoid problems of processing cost waste caused by a more stringent read count threshold and/or data loss caused by a looser read count threshold, thereby effectively suppressing occurrence of read disturb and improving performance of the rewritable non-volatile memory module.

To make the aforementioned more comprehensible, several embodiments accompanied with drawings are described in detail as follows.

DESCRIPTION OF THE EMBODIMENTS

Generally, a memory storage device (also referred to as a memory storage system) includes a rewritable non-volatile memory module and a controller (also referred to as a control circuit). The memory storage device may be used with a host system such that the host system may write data to the memory storage device or read data from the memory storage device.

Figure 1:
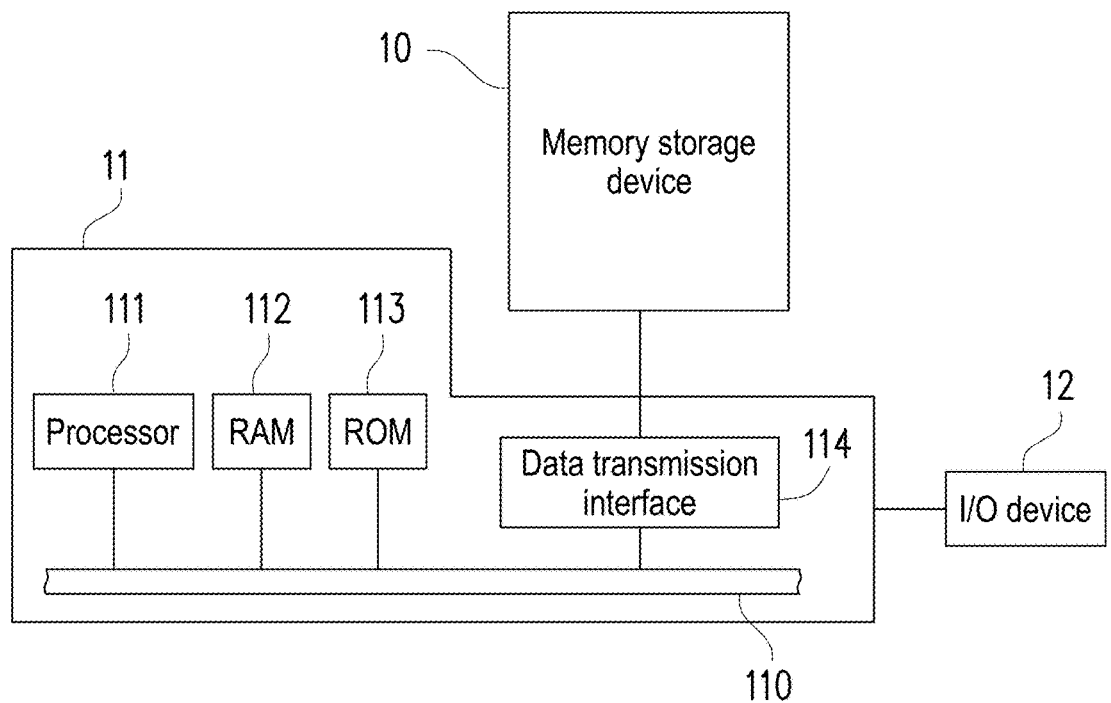
FIG. 1 is a schematic diagram of a host system, a memory storage device, and an input/output (I/O) device according to an exemplary embodiment of the disclosure.
Figure 2:
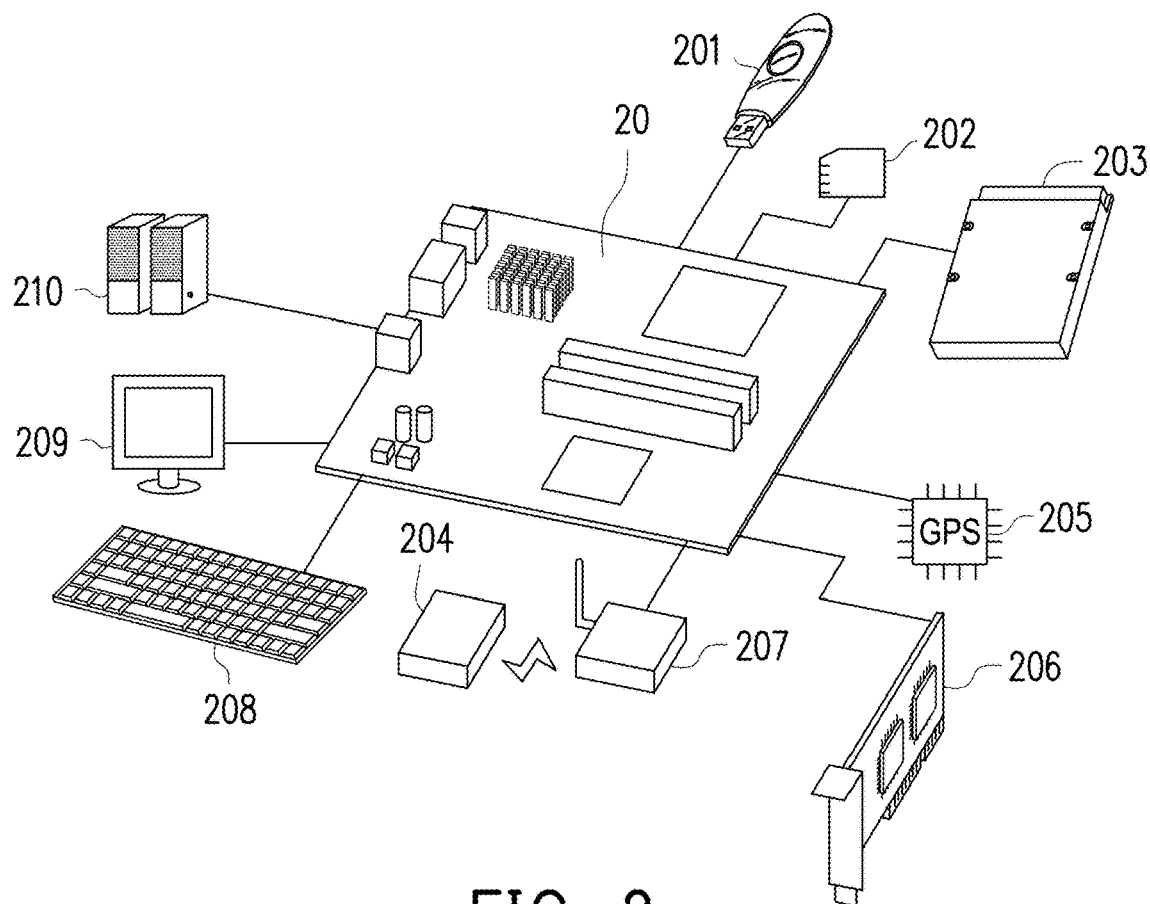
FIG. 2 is a schematic diagram of a host system, a memory storage device, and an I/O device according to an exemplary embodiment of the disclosure.

FIG. 1 is a schematic diagram of a host system, a memory storage device, and an input/output (I/O) device according to an exemplary embodiment of the disclosure. FIG. 2 is a schematic diagram of a host system, a memory storage device, and an I/O device according to an exemplary embodiment of the disclosure.

Referring to FIG. 1 and FIG. 2, a host system 11 may include a processor 111, a random access memory (RAM) 112, a read only memory (ROM) 113 and a data transmission interface 114. The processor 111, the random access memory 112, the read only memory 113 and the data transmission interface 114 may be coupled to a system bus 110.

In an exemplary embodiment, the host system 11 is coupled to the memory storage device 10 through the data transmission interface 114. For example, the host system 11 may store data to or read data from the memory storage device 10 through the data transmission interface 114. In addition, the host system 11 is coupled to an I/O device 12 through the system bus 110. For example, the host system 11 may transmit an output signal to the I/O device 12 or receive an input signal from the I/O device 12 via the system bus 110.

In an exemplary embodiment, the processor 111, the random access memory 112, the read only memory 113 and the data transmission interface 114 may be disposed on a motherboard 20 of the host system 11. A number of the data transmission interfaces 114 may be one or more. Through the data transmission interface 114, the motherboard 20 may be coupled to the memory storage device 10 through wired or wireless manner.

In an exemplary embodiment, the memory storage device 10 may be, for example, a USB flash drive 201, a memory card 202, a solid state drive (SSD) 203 or a wireless memory storage device 204. The wireless memory storage device 204 may be, for example, a Near Field Communication (NFC) memory storage device, a wireless fidelity (Wi-Fi) memory storage device, a Bluetooth memory storage device or a low power consumption Bluetooth memory storage device (e.g., iBeacon) and other memory storage devices based on various wireless communication technologies. In addition, the motherboard 20 may also be coupled to various I/O devices such as a Global Positioning System (GPS) module 205, a network interface card 206, a wireless transmission device 207, a keyboard 208, a screen 209, a speaker 210, etc., through the system bus 110. For example, in an exemplary embodiment, the motherboard 20 may access the wireless memory storage device 204 through the wireless transmission device 207.

In an exemplary embodiment, the host system 11 is a computer system. In an exemplary embodiment, host system 11 may be any system that may substantially cooperate with a memory storage device to store data. In an exemplary embodiment, the memory storage device 10 and the host system 11 may respectively include a storage device 30 and a system 31 of FIG. 3.

Figure 3:
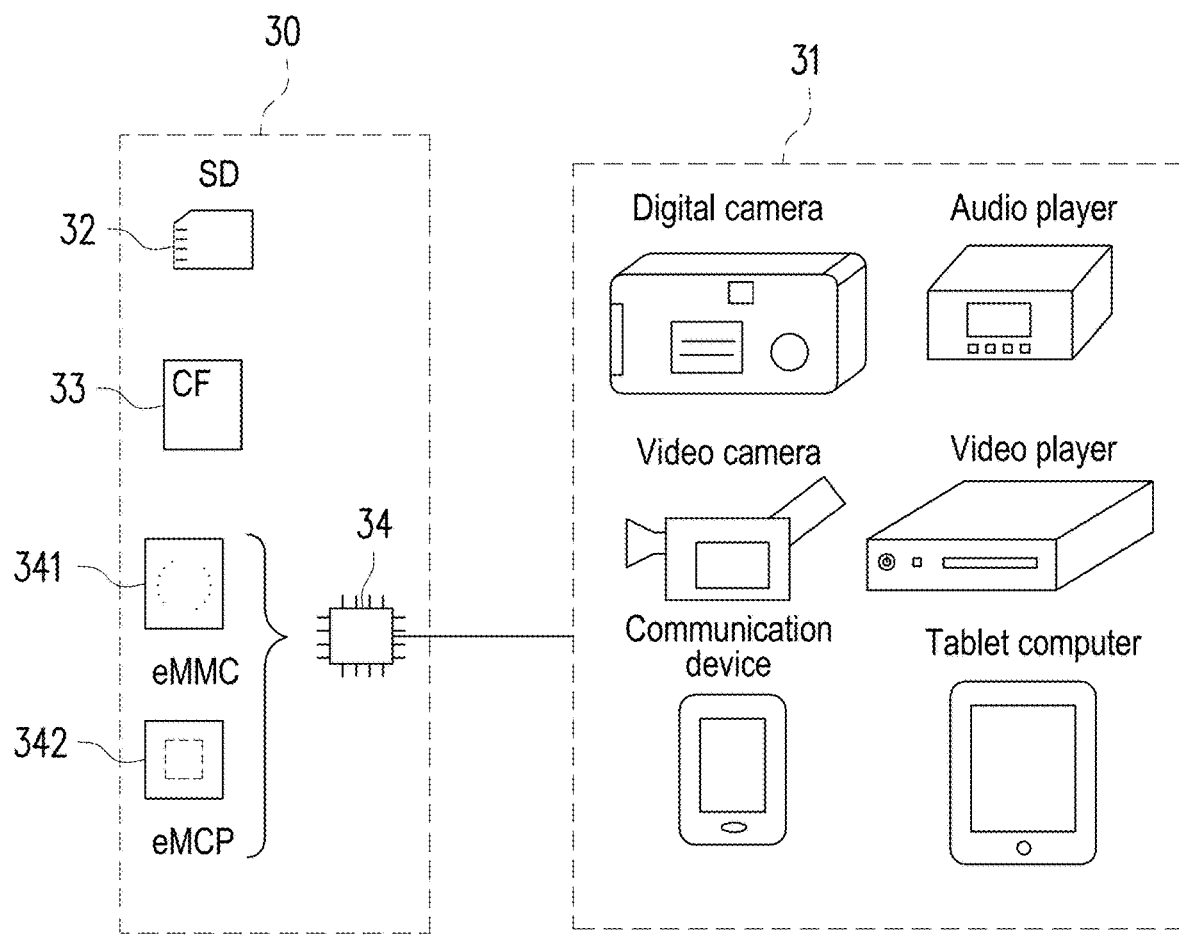
FIG. 3 is a schematic diagram of a system and a storage device according to an exemplary embodiment of the disclosure.

FIG. 3 is a schematic diagram of a system and a storage device according to an exemplary embodiment of the disclosure.

Referring to FIG. 3, the storage device 30 may be used in collaboration with the system 31 to store data. For example, the system 31 may be a digital camera, a video camera, a communication device, an audio player, a video player or a tablet computer, or other system. For example, the storage device 30 may be various non-volatile memory storage devices used by the system 31, such as a Secure Digital (SD) card 32, a Compact Flash (CF) card 33 or an embedded storage device 34, etc. The embedded storage device 34 includes various types of embedded storage devices having memory modules directly coupled to a substrate of the host system such as an embedded Multi Media Card (eMMC) 341 and/or an embedded Multi Chip Package (eMCP) storage device 342.

Figure 4:
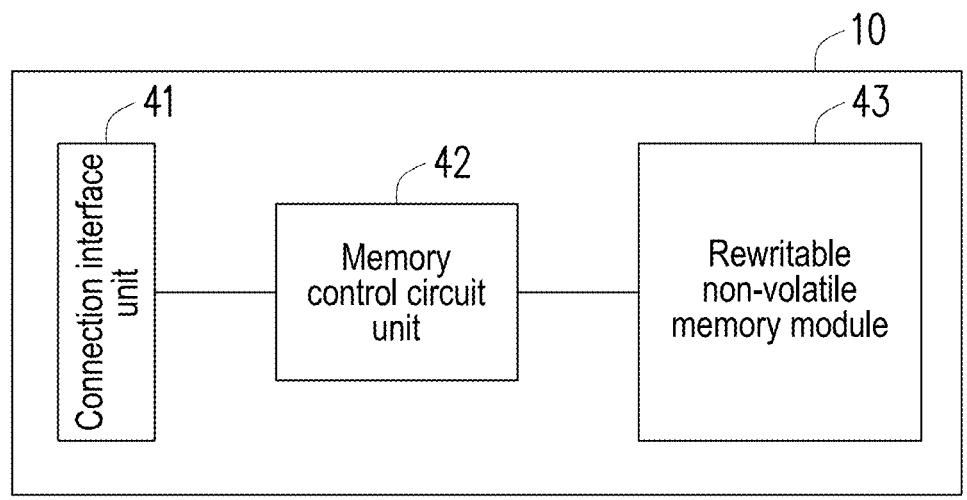
FIG. 4 is a block diagram of a memory storage device according to an exemplary embodiment of the disclosure.

FIG. 4 is a block diagram of a memory storage device according to an exemplary embodiment of the disclosure.

Referring to FIG. 4, the memory storage device 10 includes a connection interface unit 41, a memory control circuit unit 42 and a rewritable non-volatile memory module 43.

The connection interface unit 41 is configured to couple the memory storage device 10 to the host system 11. The memory storage device 10 may communicate with the host system 11 through the connection interface unit 41. In an exemplary embodiment, the connection interface unit 41 is compatible with Peripheral Component Interconnect Express (PCI Express) standard. In an exemplary embodiment, the connection interface unit 41 may also be compatible with Serial Advanced Technology Attachment (SATA) standard, Parallel Advanced Technology Attachment (PATA) standard, Institute of Electrical and Electronics Engineers (IEEE) 1394 standard, Universal Serial Bus (USB) standard, SD interface standard, Ultra-High Speed-I (UHS-I) interface standard, Ultra-High Speed-II (UHS-II) interface standard, Memory Stick (MS) interface standard, MCP interface standard, MMC interface standard, eMMC interface standard, Universal Flash Storage (UFS) interface standard, eMCP interface standard, CF interface standard, Integrated Device Electronics (IDE) standard or other suitable standards. The connection interface unit 41 and the memory control circuit unit 42 may be packaged in a chip, or the connection interface unit 41 may be arranged outside a chip including the memory control circuit unit 42.

The memory control circuit unit 42 is coupled to the connection interface unit 41 and the rewritable non-volatile memory module 43. The memory control circuit unit 42 is configured to execute a plurality of logic gates or control instructions implemented in hardware mode or firmware mode and perform data writing, reading and erasing operations in the rewritable non-volatile memory module 43 according to the instructions of the host system 11.

The rewritable non-volatile memory module 43 is configured to store data written by the host system 11. The rewritable non-volatile memory module 43 may include a single level cell (SLC) NAND flash memory module (i.e., a flash memory module that may store 1 bit in one memory cell), a multi-level cell (MLC) NAND flash memory module (i.e., a flash memory module that may store 2 bits in one memory cell), a triple level cell (TLC) NAND flash memory module (i.e., a flash memory module that may store 3 bits in one memory cell), a quad level cell (QLC) NAND flash memory module (i.e., a flash memory module that may store 4 bits in one memory cell), other flash memory modules, or other memory modules with the same characteristics.

Each memory cell in the rewritable non-volatile memory module 43 stores one or more bits at a change in voltage (hereinafter also referred to as a threshold voltage). Specifically, there is a charge trapping layer between a control gate and a channel of the each of the memory cell. By applying a writing voltage to the control gate, an amount of electrons in the charge trapping layer may be changed, thereby changing the threshold voltage of the memory cell. The operation of changing the threshold voltage of the memory cell is also called "writing data to the memory cell" or "programming the memory cell." As the threshold voltage changes, the each of the memory cell in the rewritable non-volatile memory module 43 has multiple storage states. By applying a reading voltage, it is possible to determine the storage state of a memory cell and obtain one or more bits stored in the memory cell.

In an exemplary embodiment, the memory cell of the rewritable non-volatile memory module 43 may constitute multiple physical programming units, and the physical programming units may constitute multiple physical erasing units. Specifically, the memory cell on a same word line may constitute one or more physical programming units. If the each of the memory cell may store more than 2 bits, the physical programming unit on the same word line may be classified as at least a lower physical programming unit and an upper physical programming unit. For example, a least significant bit (LSB) of a memory cell belongs to the lower physical programming unit, and a most significant bit (MSB) of a memory cell belongs to the upper physical programming unit. Generally, in the MLC NAND flash memory, a writing speed of the lower physical programming unit is greater than a writing speed of the upper physical programming unit, and/or reliability of the lower physical programming unit is higher than reliability of the upper physical programming unit.

In an exemplary embodiment, physical programming unit is the smallest unit of programming. Namely, the physical programming unit is the smallest unit for writing data. For example, the physical programming unit may be a physical page or a physical sector. If the physical programming units is a physical page, then the physical programming units may include a data bit region and a redundancy bit region. The data bit region includes multiple physical sectors to store user data, while the redundancy bit region is configured to store system data (e.g., management data such as error correcting code). In an exemplary embodiment, the data bit region includes 32 physical sectors, and a size of one physical sector is 512 bytes (B). However, in other exemplary embodiments, the data bit region may also include 8, 16, or more or less physical sectors, and the size of each physical sector may also be larger or smaller. On the other hand, the physical erasing unit is the smallest unit of erasing. Namely, each of the physical erasing unit includes a minimum number of erased memory cells. For example, the physical erasing unit is a physical block.

Figure 5:
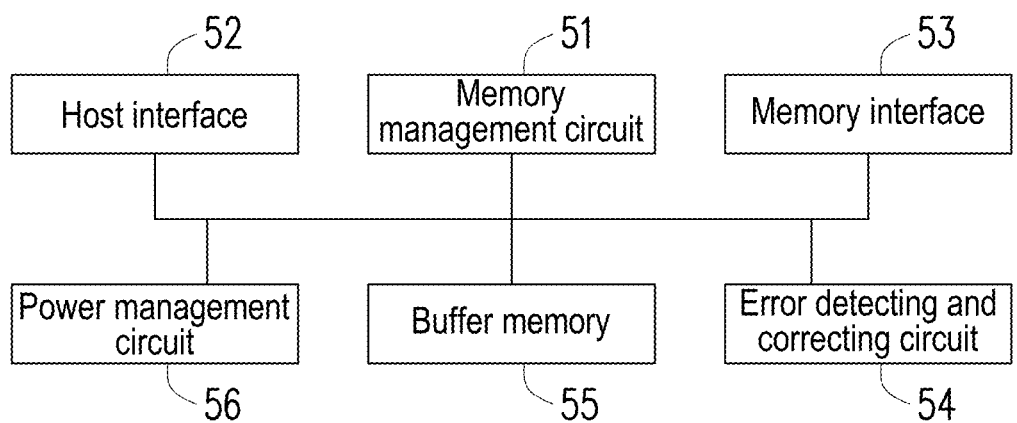
FIG. 5 is a block diagram of a memory control circuit unit according to an exemplary embodiment of the disclosure.

FIG. 5 is a block diagram of a memory control circuit unit according to an exemplary embodiment of the disclosure.

Referring to FIG. 5, the memory control circuit unit 42 includes a memory management circuit 51, a host interface 52 and a memory interface 53.

The memory management circuit 51 is configured to control an overall operation of the memory control circuit unit 42. Specifically, the memory management circuit 51 has multiple control instructions, and when the memory storage device 10 operates, the control instructions are executed for data writing, reading, and erasing operations, etc. When the operation of the memory management circuit 51 is described below, it is equivalent to describing the operation of the memory control circuit unit 42.

In an exemplary embodiment, the control instructions of the memory management circuit 51 are implemented in a firmware form. For example, the memory management circuit 51 has a microprocessor unit (not shown) and a read only memory (not shown), and these control instructions are programmed into the read only memory. When the memory storage device 10 is operating, the control instructions are executed by the microprocessor unit for data writing, reading, erasing and other operations.

In an exemplary embodiment, the control instructions of the memory management circuit 51 may also be stored in a specific region of the rewritable non-volatile memory module 43 in program code form (e.g., a system region in the memory module dedicated to system data storage). In addition, the memory management circuit 51 has a microprocessor unit (not shown), a read only memory (not shown) and a random access memory (not shown). In particular, the read only memory has a boot code, and when the memory control circuit unit 42 is enabled, the microprocessor unit may first execute the boot code to load the control instructions stored in the rewritable non-volatile memory module 43 into the random access memory of the memory management circuit 51. Thereafter, the microprocessor unit may run the control instructions to write, read, and erase data.

In an exemplary embodiment, the control instructions of the memory management circuit 51 may also be implemented in a hardware form. For example, the memory management circuit 51 includes a microcontroller, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microcontroller. The memory cell management circuit is configured to manage the memory cells or memory cell groups of the rewritable non-volatile memory module 43. The memory writing circuit is configured to issue a writing instruction sequence to the rewritable non-volatile memory module 43 to write data into the rewritable non-volatile memory module 43. The memory reading circuit is configured to issue a reading instruction sequence to the rewritable non-volatile memory module 43 to read data from the rewritable non-volatile memory module 43. The memory erasing circuit is configured to issue an erasing instruction sequence to the rewritable non-volatile memory module 43 to erase data from the rewritable non-volatile memory module 43. The data processing circuit is configured to process data to be written into the rewritable non-volatile memory module 43 and data to be read from the rewritable non-volatile memory module 43. The writing instruction sequence, the reading instruction sequence and the erasing instruction sequence may individually include one or more program codes or instruction codes and are used to instruct the rewritable non-volatile memory module 43 to perform corresponding writing, reading and erasing operations. In an exemplary embodiment, the memory management circuit 51 may also issue other types of instruction sequences to the rewritable non-volatile memory module 43 to instruct execution of corresponding operations.

The host interface 52 is coupled to the memory management circuit 51. The memory management circuit 51 may communicate with the host system 11 through the host interface 52. The host interface 52 may be configured to receive and identify instructions and data transmitted by the host system 11. For example, the instructions and the data transmitted by the host system 11 may be transmitted to the memory management circuit 51 through the host interface 52. In addition, the memory management circuit 51 may transmit data to the host system 11 through the host interface 52. In the exemplary embodiment, the host interface 52 is compatible with the PCI Express standard. However, it should be noted that the disclosure is not limited thereto. The host interface 52 may also be compatible with SATA standard, PATA standard, IEEE 1394 standard, USB standard, SD standard, UHS-I standard, UHS-II standard, MS standard, MMC standard, eMMC standard, UFS standard, CF standard, IDE standard or other suitable data transmission standards.

The memory interface 53 is coupled to the memory management circuit 51 and configured to access the rewritable non-volatile memory module 43. For example, the memory management circuit 51 may access the rewritable non-volatile memory module 43 through the memory interface 53. Namely, the data to be written to the rewritable non-volatile memory module 43 may be converted into a format acceptable to the rewritable non-volatile memory module 43 through the memory interface 53. Specifically, if the memory management circuit 51 is to access the rewritable non-volatile memory module 43, the memory interface 53 may transmit corresponding instruction sequences. For example, these instruction sequences may include a writing instruction sequence instructing to write data, a reading instruction sequence instructing to read data, an erasing instruction sequence instructing to erase data, and corresponding instruction sequences to instruct various memory operations (e.g., changing read voltage levels or performing garbage collection operation, etc.). The instruction sequences are, for example, generated by the memory management circuit 51 and transmitted to the rewritable non-volatile memory module 43 through the memory interface 53. The instruction sequences may include one or more signals or data on the bus. The signals or data may include instruction codes or program codes. For example, in the reading instruction sequence, information such as a read identifier and a memory address will be included.

In an exemplary embodiment, the memory control circuit unit 42 further includes an error checking and correcting circuit 54, a buffer memory 55 and a power management circuit 56.

The error checking and correcting circuit 54 is coupled to the memory management circuit 51 and is configured to perform an error checking and correcting operation to ensure correctness of data. Specifically, when the memory management circuit 51 receives a writing instruction from the host system 11, the error checking and correcting circuit 54 generates a corresponding error correcting code (ECC) and/or an error detecting code (EDC) for the data corresponding to the writing instruction, and the memory management circuit 51 may write the data corresponding to the writing instruction and the corresponding error correcting code and/or error detecting code into the rewritable non-volatile In memory module 43. Thereafter, when the memory management circuit 51 reads data from the rewritable non-volatile memory module 43, the memory management circuit 51 also reads the error correcting code and/or error detecting code corresponding to the data, and the error checking and correcting circuit 54 performs the error checking and correcting operation on the read data based on the error correcting code and/or error detecting code.

The buffer memory 55 is coupled to the memory management circuit 51 and is configured to temporarily store data. The power management circuit 56 is coupled to the memory management circuit 51 and is configured to control power of the memory storage device 10.

In an exemplary embodiment, the rewritable non-volatile memory module 43 of FIG. 4 may include a flash memory module. In an exemplary embodiment, the memory control circuit unit 42 of FIG. 4 may include a flash memory controller. In an exemplary embodiment, the memory management circuit 51 of FIG. 5 may include a flash memory management circuit.

Figure 6:
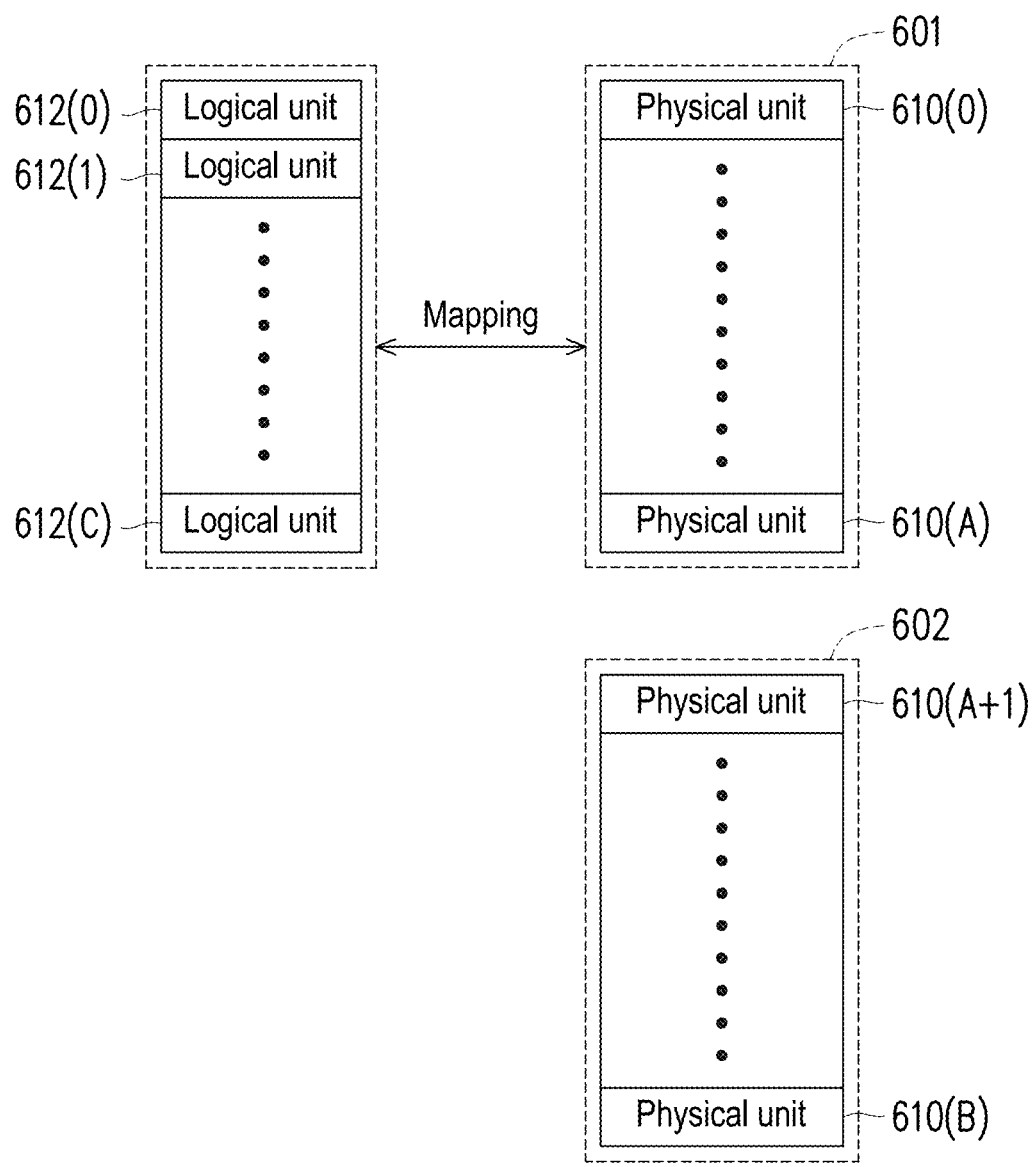
FIG. 6 is a schematic diagram of managing a rewritable non-volatile memory module according to an exemplary embodiment of the disclosure.

FIG. 6 is a schematic diagram of managing a rewritable non-volatile memory module according to an exemplary embodiment of the disclosure.

Referring to FIG. 6, the memory management circuit 51 may logically group physical units 610(0)-610(B) in the rewritable non-volatile memory module 43 into a storage region 601 and a spare region 602. One physical unit refers to one virtual block (VB). One virtual block may include multiple physical programming units. For example, one virtual block may include one or more physical erasing units.

The physical units 610(0)-610(A) in the storage region 601 are configured to store user data (for example, user data from the host system 11 in FIG. 1). For example, the physical units 610(0)-610(A) in the storage region 601 may store valid data and invalid data. The physical units 610(A+1)-610(B) in the spare region 602 do not store data (for example, valid data). For example, if a certain physical unit does not store valid data, this physical unit may be associated (or added) to the spare region 602. In addition, the physical units in the spare region 602 (or the physical units that do not store valid data) may be erased. When new data is written, one or more physical units may be retrieved from spare region 602 to store the new data. In an exemplary embodiment, the spare region 602 is also referred to as a free pool.

The memory management circuit 51 may configure logical units 612(0)-612(C) to map the physical units 610(0)-610(A) in the storage region 601. In an exemplary embodiment, each logical unit corresponds to one logical address. For example, one logical address may include one or more logical block addresses (LBA) or other logical management units.

It should be noted that one logical unit may be mapped to one or more physical units. If a certain physical unit is currently mapped by a certain logical unit, it means that the data currently stored in this physical unit contains valid data. On the contrary, if a certain physical unit is currently not mapped by any logical unit, it means that the data currently stored in this physical unit does not contain any valid data.

The memory management circuit 51 may record management data (which is also referred to as logical-to-physical mapping information) describing a mapping relationship between the logical units and the physical units in at least one logical-to-physical mapping table. When the host system 11 intends to read data from the memory storage device 10 or write data to the memory storage device 10, the memory management circuit 51 may perform data access operations on the memory storage device 10 according to the information in the logical-to-physical mapping table.

In order to set an appropriate read count threshold, the disclosure provides a memory control method, a memory storage device and a memory control circuit unit that may adaptively adjust a read count threshold of the physical erasing unit according to actual usage conditions, so as to effectively suppress a probability of read disturb and improve the performance of the memory storage device 10.

First, the memory management circuit 51 may set a plurality of preset read count thresholds respectively corresponding to a plurality of physical erasing units in the rewritable non-volatile memory module 43. Specifically, the memory management circuit 51 may first adopt more stringent preset read count thresholds to avoid problems such as data loss caused by failure to perform operations to prevent read disturb in a timely manner.

Figure 7:
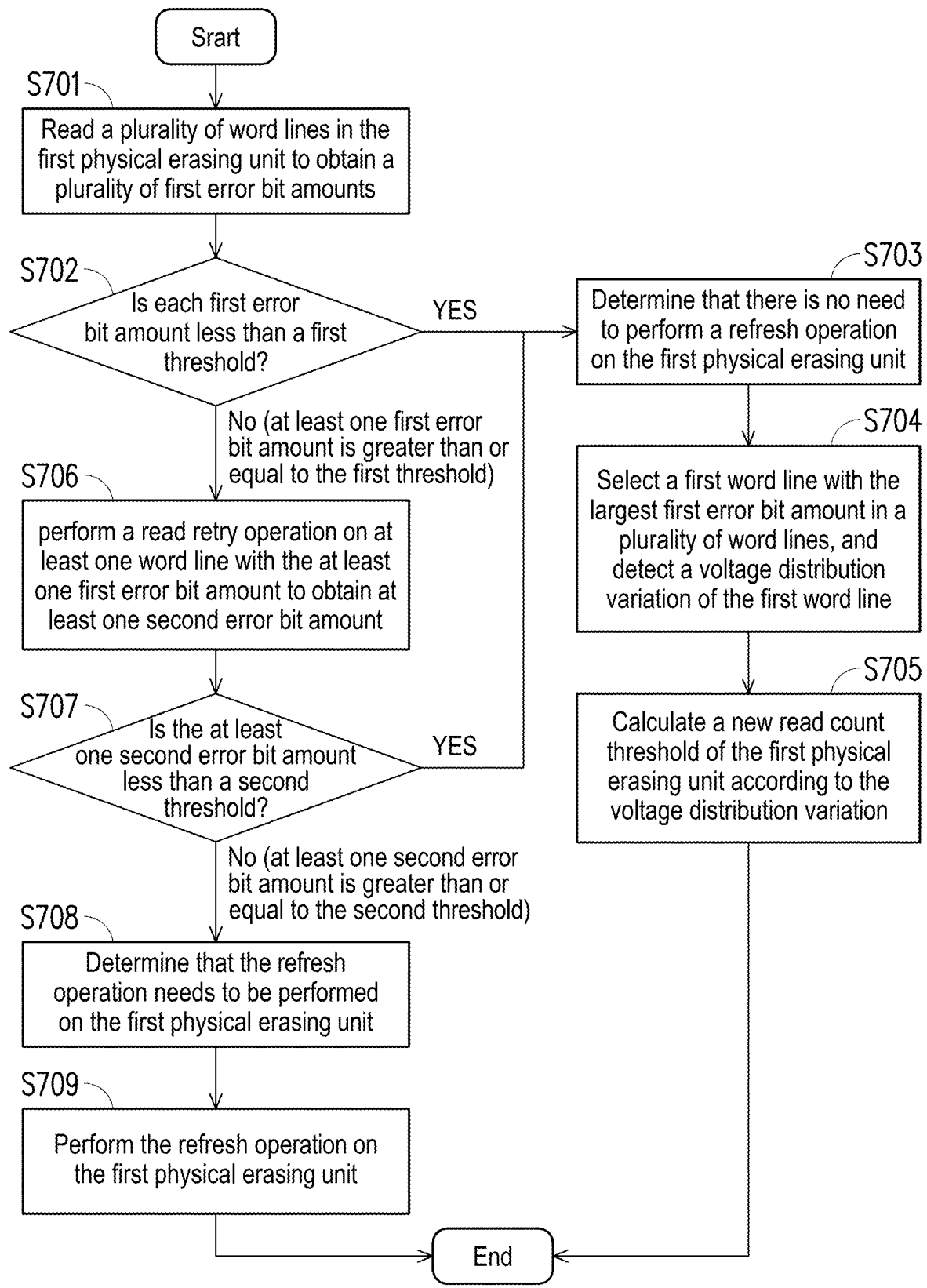
FIG. 7 is a flowchart of a memory control method according to an exemplary embodiment of the disclosure.

Then, in the background operation (for example, the memory storage device 10 is in the sleep mode), when a read count of the first physical erasing unit in a plurality of physical erasing units is greater than its corresponding preset read count threshold, the memory management circuit 51 may execute the memory control method as shown in FIG. 7.

FIG. 7 is a flowchart of a memory control method according to an exemplary embodiment of the disclosure. Referring to FIG. 7.

In step S701, the memory management circuit 51 may read a plurality of word lines in the first physical erasing unit to obtain a plurality of first error bit amounts. Specifically, the memory management circuit 51 may read a plurality of physical programming units respectively corresponding to a plurality of word lines to obtain a plurality of first error bit amounts.

In step S702, the memory management circuit 51 may determine whether a plurality of first error bit amounts are all less than a first threshold. If a plurality of first error bit amounts are all less than the first threshold, step S703 is executed; otherwise, if at least one first error bit amount is greater than or equal to the first threshold, step S706 is executed.

In step S703, the memory management circuit 51 may determine that there is no need to perform a refresh operation on the first physical erasing unit.

Then, in step S704, the memory management circuit 51 may select a first word line with the largest first error bit amount in a plurality of word lines, and detect a voltage distribution variation of the first word line.

Accordingly, in step S705, the memory management circuit 51 may calculate a new read count threshold of the first physical erasing unit according to the voltage distribution variation.

Specifically, the memory management circuit 51 may obtain a program/erase cycle count of the first physical erasing unit, and obtain a threshold upper limit according to the program/erase cycle count. The threshold upper limit may be used as a correction parameter to define and upper limit of the new read count threshold.

In an exemplary embodiment, the memory management circuit 51 may calculate the new read count threshold according to the voltage distribution variation, the read count, the program/erase cycle count, and the threshold upper limit. Further, the memory management circuit 51 may collect a plurality of parameters related to a current usage status of the first physical erasing unit, i.e., the read count and the program/erase cycle count. Then, the memory management circuit 51 may calculate an expected voltage distribution variation according to the read count and the program/erase cycle count.

If the voltage distribution variation is greater than or equal to the expected voltage distribution variation, the memory management circuit 51 may decrease the preset read count threshold to generate the new read count threshold; on the contrary, if the voltage distribution variation is less than the expected voltage distribution variation, the memory management circuit 51 may increase the preset read count threshold, and generate the new read count threshold based on the threshold upper limit.

In another exemplary embodiment, the memory management circuit 51 may generate a predicted voltage distribution variation according to the program/erase cycle count and the read count through a threshold generation model (not shown). In the exemplary embodiment, the threshold generation model may be, for example, a support vector machines (SVM) model, a decision tree model, a polynomial regression model, a linear regression model or a recurrent neural network (RNN) model or a combination of two or more of the above.

Then, the memory management circuit 51 may compare the voltage distribution variation with the predicted voltage distribution variation to calculate the new read count threshold. Specifically, the memory management circuit 51 may compare the voltage distribution variation with the predicted voltage distribution variation to obtain a reference variable.

Finally, the memory management circuit 51 may generate the new read count threshold based on the reference variable and the threshold upper limit.

Accordingly, the memory management circuit 51 may adaptively adjust the read count threshold of the first physical erasing unit according to the actual usage status of the first physical erasing unit. In this way, the memory management circuit 51 may provide the most appropriate read count threshold (i.e., the new read count threshold) to the first physical erasing unit to avoid problems of processing cost waste caused by providing a stringent read count threshold and/or data loss caused by providing a loose read count threshold, so as to improve the performance of the rewritable non-volatile memory module 43.

On the other hand, in step S706, the memory management circuit 51 may perform a read retry operation on at least one word line with the at least one first error bit amount to obtain at least one second error bit amount.

Then, in step S707, the memory management circuit 51 may determine whether the at least one second error bit amount is less than a second threshold. If the at least one second error bit amount is less than the second threshold, step S703 is executed, and steps S704 and S705 are sequentially executed to obtain the new read count threshold of the first physical erasing unit. The implementation details of steps S703 to S705 have been described in detail in the aforementioned content, which will not be repeated here.

On the contrary, if at least one second error bit amount is greater than or equal to the second threshold, step S708 is executed.

In an exemplary embodiment, the first threshold is greater than or equal to the second threshold. In another exemplary embodiment, the first threshold is less than the second threshold. The disclosure is not limited to the setting of the first threshold and the second threshold.

In step S708, the memory management circuit 51 may determine that the refresh operation needs to be performed on the first physical erasing unit.

Finally, in step S709, the memory management circuit 51 may perform the refresh operation on the first physical erasing unit. Specifically, the memory management circuit 51 may copy the data stored in the first physical erasing unit to other physical erasing units in the rewritable non-volatile memory module 43 to avoid occurrence of read disturb.

Figure 8:
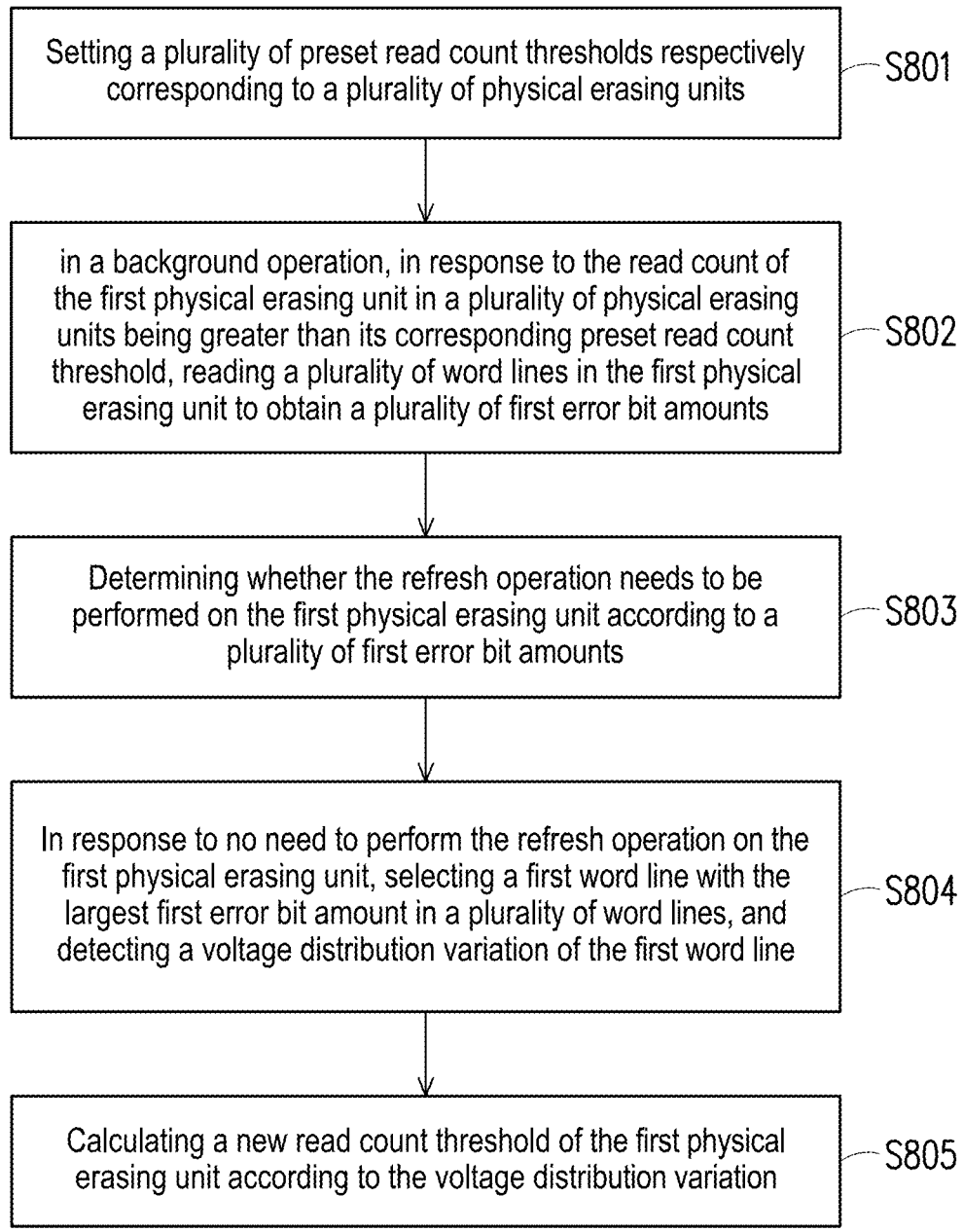
FIG. 8 is a flowchart of a memory control method according to an exemplary embodiment of the disclosure.

FIG. 8 is a flowchart of a memory control method according to an exemplary embodiment of the disclosure. Referring to FIG. 8.

In step S801, setting a plurality of preset read count thresholds respectively corresponding to a plurality of physical erasing units.

In step S802, in a background operation, in response to the read count of the first physical erasing unit in a plurality of physical erasing units being greater than its corresponding preset read count threshold, reading a plurality of word lines in the first physical erasing unit to obtain a plurality of first error bit amounts.

In step S803, determining whether a refresh operation needs to be performed on the first physical erasing unit according to a plurality of first error bit amounts.

In step S804, in response to no need to perform the refresh operation on the first physical erasing unit, selecting a first word line with the largest first error bit amount in a plurality of word lines, and detecting a voltage distribution variation of the first word line.

In step S805, calculating a new read count threshold of the first physical erasing unit according to the voltage distribution variation.

Regarding implementation details of steps S801 to S805, they have been described in detail in the aforementioned exemplary embodiments, so that they will not be repeated here. It should be noted that each step in FIG. 8 may be implemented as a plurality of program codes or circuits, which is not limited by the disclosure.

In addition, the method in FIG. 8 may be used in collaboration with the above exemplary embodiments or may be used alone, which is not limited by the disclosure.

In summary, according to the memory control method, the memory storage device and the memory control circuit unit of the disclosure, in the background mode, when a read count of a physical erasing unit is greater than its preset read count threshold, the memory storage device may determine whether a refresh operation needs to be performed on this physical erasing unit. If it is determined that the refresh operation is required, the memory storage device performs the refresh operation on the physical erasing unit; conversely, if it is determined that the refresh operation is not required, the memory storage device calculates the new read count threshold based on the voltage distribution variation of the word line with the largest error bit amount in the physical erasing unit and other parameters related to the current usage status of the physical erasing unit.

In other words, the memory control method, the memory storage device and the memory control circuit unit of the disclosure may adaptively adjust the read count threshold of the physical erasing unit according to actual usage conditions to avoid problems of processing cost waste caused by a more stringent read count threshold and/or data loss caused by a looser read count threshold, thereby effectively suppressing occurrence of read disturb and improving performance of the rewritable non-volatile memory module.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A memory control method, adapted to a memory storage device, wherein the memory storage device comprises a rewritable non-volatile memory module, the rewritable non-volatile memory module comprises a plurality of physical erasing units, the memory control method comprising:
    setting a plurality of preset read count thresholds respectively corresponding to the plurality of physical erasing units;
    in a background operation, in response to a read count of a first physical erasing unit in the plurality of physical erasing units being greater than its corresponding preset read count threshold, reading a plurality of word lines in the first physical erasing unit to obtain a plurality of first error bit amounts;
    determining whether a refresh operation needs to be performed on the first physical erasing unit according to the plurality of first error bit amounts;
    in response to no need to perform the refresh operation on the first physical erasing unit, selecting a first word line with the largest first error bit amount in the plurality of word lines, and detecting a voltage distribution variation of the first word line; and
    calculating a new read count threshold of the first physical erasing unit according to the voltage distribution variation,
    wherein the step of determining whether the refresh operation needs to be performed on the first physical erasing unit according to the plurality of first error bit amounts comprises:
    determining whether the plurality of first error bit amounts are all less than a first threshold; and
    in response to the plurality of first error bit amounts all being less than the first threshold, determining that the refresh operation does not need to be performed on the first physical erasing unit.

2. The memory control method as claimed in claim 1, wherein the step of determining whether the refresh operation needs to be performed on the first physical erasing unit according to the plurality of first error bit amounts comprises:
    in response to at least one first error bit amount being greater than or equal to the first threshold, performing a read retry operation on at least one word line with the at least one first error bit amount to obtain at least one second error bit amount.

3. The memory control method as claimed in claim 2, wherein the step of determining whether the refresh operation needs to be performed on the first physical erasing unit according to the plurality of first error bit amounts comprises:
    determining whether the at least one second error bit amount is less than a second threshold; and
    in response to the at least one second error bit amount being less than the second threshold, determining that the refresh operation does not need to be performed on the first physical erasing unit.

4. The memory control method as claimed in claim 3, wherein the step of determining whether the refresh operation needs to be performed on the first physical erasing unit according to the plurality of first error bit amounts comprises:
    in response to at least one of the at least one second error bit amount being greater than or equal to the second threshold, determining that the refresh operation needs to be performed on the first physical erasing unit.

5. The memory control method as claimed in claim 1, wherein the step of calculating the new read count threshold of the first physical erasing unit according to the voltage distribution variation comprises:
    obtaining a program/erase cycle count of the first physical erasing unit, and obtaining a threshold upper limit according to the program/erase cycle count.

6. The memory control method as claimed in claim 5, wherein the step of calculating the new read count threshold of the first physical erasing unit according to the voltage distribution variation comprises:
    calculating the new read count threshold according to the voltage distribution variation, the read count, the program/erase cycle count, and the threshold upper limit.

7. The memory control method as claimed in claim 5, wherein the step of calculating the new read count threshold of the first physical erasing unit according to the voltage distribution variation comprises:
    generating a predicted voltage distribution variation according to the program/erase cycle count and the read count through a threshold generation model; and
    comparing the voltage distribution variation and the predicted voltage distribution variation to calculate the new read count threshold.

8. The memory control method as claimed in claim 7, wherein the threshold generation model is one of a support vector machines (SVM) model, a decision tree model, a polynomial regression model, a linear regression model and a recurrent neural network (RNN) model.

9. The memory control method as claimed in claim 1, further comprising:
    reading a plurality of physical programming units respectively corresponding to the plurality of word lines to obtain the plurality of first error bit amounts.

10. A memory storage device, comprising:
    a connection interface unit, coupling to a host system;
    a rewritable non-volatile memory module, comprising a plurality of physical erasing units; and a memory control circuit unit, coupled to the connection interface unit and the rewritable non-volatile memory module, wherein the memory control circuit unit is configured to set a plurality of preset read count thresholds respectively corresponding to the plurality of physical erasing units, the memory control circuit unit is further configured to read a plurality of word lines in a first physical erasing unit to obtain a plurality of first error bit amounts in response to a read count of the first physical erasing unit in the plurality of physical erasing units being greater than its corresponding preset read count threshold in a background operation, the memory control circuit unit is further configured to determine whether a refresh operation needs to be performed on the first physical erasing unit according to the plurality of first error bit amounts, the memory control circuit unit is further configured to select a first word line with the largest first error bit amount in the plurality of word lines in response to no need to perform the refresh operation on the first physical erasing unit, and detect a voltage distribution variation of the first word line;

the memory control circuit unit is further configured to calculate a new read count threshold of the first physical erasing unit according to the voltage distribution variation, wherein the memory control circuit unit is further configured to determine whether the plurality of first error bit amounts are all less than a first threshold, and the memory control circuit unit is further configured to determine that the refresh operation does not need to be performed on the first physical erasing unit in response to the plurality of first error bit amounts all being less than the first threshold.

11. The memory storage device as claimed in claim 10, wherein the memory control circuit unit is further configured to perform a read retry operation on at least one word line having at least one first error bit amount to obtain at least one second error bit amount in response to the at least one first error bit amount being greater than or equal to the first threshold.

12. The memory storage device as claimed in claim 11, wherein the memory control circuit unit is further configured to determine whether the at least one second error bit amount is less than a second threshold, and the memory control circuit unit is further configured to determine that the refresh operation does not need to be performed on the first physical erasing unit in response to the at least one second error bit amount being less than the second threshold.

13. The memory storage device as claimed in claim 12, wherein the memory control circuit unit is further configured to determine that the refresh operation needs to be performed on the first physical erasing unit in response to at least one of the at least one second error bit amount being greater than or equal to the second threshold.

14. The memory storage device as claimed in claim 10, wherein the memory control circuit unit is further configured to obtain a program/erase cycle count of the first physical erasing unit, and obtain a threshold upper limit according to the program/erase cycle count.

15. The memory storage device as claimed in claim 14, wherein the memory control circuit unit is further configured to calculate the new read count threshold according to the voltage distribution variation, the read count, the program/erase cycle count, and the threshold upper limit.

16. The memory storage device as claimed in claim 14, wherein the memory control circuit unit is further configured to generate a predicted voltage distribution variation according to the program/erase cycle count and the read count through a threshold generation model, and the memory control circuit unit is further configured to compare the voltage distribution variation and the predicted voltage distribution variation to calculate the new read count threshold.

17. The memory storage device as claimed in claim 16, wherein the threshold generation model is one of a support vector machines (SVM) model, a decision tree model, a polynomial regression model, a linear regression model and a recurrent neural network (RNN) model.

18. The memory storage device as claimed in claim 10, wherein the memory control circuit unit is further configured to read a plurality of physical programming units respectively corresponding to the plurality of word lines to obtain the plurality of first error bit amounts.

19. A memory control circuit unit, configured to control a rewritable non-volatile memory module, the rewritable non-volatile memory module comprising a plurality of physical erasing units, and the memory control circuit unit comprising:

a host interface, configured to couple to a host system;

a memory interface, configured to couple to the rewritable non-volatile memory module;

a memory management circuit, coupled to the host interface and the memory interface, wherein the memory management circuit is configured to set a plurality of preset read count thresholds respectively corresponding to the plurality of physical erasing units, the memory management circuit is further configured to read a plurality of word lines in the first physical erasing unit to obtain a plurality of first error bit amounts in response to a read count of a first physical erasing unit in the plurality of physical erasing units being greater than its corresponding preset read count threshold in a background operation, the memory management circuit is further configured to determine whether a refresh operation needs to be performed on the first physical erasing unit according to the plurality of first error bit amounts, the memory management circuit is further configured to select a first word line with the largest first error bit amount in the plurality of word lines in response to no need to perform the refresh operation on the first physical erasing unit, and detect a voltage distribution variation of the first word line, the memory management circuit is further configured to calculate a new read count threshold of the first physical erasing unit according to the voltage distribution variation, wherein the memory management circuit is further configured to determine whether the plurality of first error bit amounts are all less than a first threshold, and the memory management circuit is further configured to determine that the refresh operation does not need to be performed on the first physical erasing unit in response to the plurality of first error bit amounts all being less than the first threshold.

20. The memory control circuit unit as claimed in claim 19, wherein the memory management circuit is further configured to perform a read retry operation on at least one word line having the at least one first error bit amount to obtain at least one second error bit amount in response to the at least one first error bit amount being greater than or equal to the first threshold.

21. The memory control circuit unit as claimed in claim 20, wherein the memory management circuit is further configured to determine whether the at least one second error bit amount is less than a second threshold, and the memory management circuit is further configured to determine that the refresh operation does not need to be performed on the first physical erasing unit in response to the at least one second error bit amount being less than the second threshold.

22. The memory control circuit unit as claimed in claim 21, wherein the memory management circuit is further configured to determine that the refresh operation needs to be performed on the first physical erasing unit in response to at least one of the at least one second error bit amount being greater than or equal to the second threshold.

23. The memory control circuit unit as claimed in claim 19, wherein the memory management circuit is further configured to obtain a program/erase cycle count of the first physical erasing unit, and obtain a threshold upper limit according to the program/erase cycle count.

24. The memory control circuit unit as claimed in claim 23, wherein the memory management circuit is further configured to calculate the new read count threshold according to the voltage distribution variation, the read count, the program/erase cycle count, and the threshold upper limit.

25. The memory control circuit unit as claimed in claim 23, wherein the memory management circuit is further configured to generate a predicted voltage distribution variation according to the program/erase cycle count and the read count through a threshold generation model, and the memory management circuit is further configured to compare the voltage distribution variation and the predicted voltage distribution variation to calculate the new read count threshold.

26. The memory control circuit unit as claimed in claim 25, wherein the threshold generation model is one of a support vector machines (SVM) model, a decision tree model, a polynomial regression model, a linear regression model and a recurrent neural network (RNN) model.

27. The memory control circuit unit as claimed in claim 19, wherein the memory management circuit is further configured to read a plurality of physical programming units respectively corresponding to the plurality of word lines to obtain the plurality of first error bit amounts.

* * * * *